United States Patent [19]
Yamaoka et al.

[11] Patent Number: 5,946,575
[45] Date of Patent: Aug. 31, 1999

[54] METHOD FOR MANUFACTURING LOW BREAKDOWN VOLTAGE MOS AND HIGH BREAKDOWN VOLTAGE MOS

[75] Inventors: Toru Yamaoka, Kyoto; Hirotsugu Honda, Nagaokakyo; Hiroshi Sakurai, Kyoto, all of Japan

[73] Assignee: Matsushita Electronics Corporation, Osaka, Japan

[21] Appl. No.: 08/807,852

[22] Filed: Feb. 26, 1997

[30] Foreign Application Priority Data

Sep. 26, 1996 [JP] Japan ................................. 8-236302

[51] Int. Cl.⁶ ............................................. H01L 21/8236
[52] U.S. Cl. ..................... 438/276; 438/302; 438/305; 438/307; 438/291
[58] Field of Search ................................. 438/289, 302, 438/303, 305, FOR 168, FOR 205, FOR 216, FOR 217, FOR 218, 291, 275, 276, 306, 307

[56] References Cited

U.S. PATENT DOCUMENTS

| | | | |
|---|---|---|---|
| 5,166,087 | 11/1992 | Kakimoto et al. | 437/44 |
| 5,296,401 | 3/1994 | Mitsui et al. | 437/57 |
| 5,413,945 | 5/1995 | Chien et al. | 437/35 |

FOREIGN PATENT DOCUMENTS

| | | | |
|---|---|---|---|
| 1-114069 | 5/1989 | Japan . | |
| 4-01-196862 | 8/1989 | Japan | 438/FOR 205 |

*Primary Examiner*—Peter Toby Brown
*Assistant Examiner*—Long Pham
*Attorney, Agent, or Firm*—McDermott, Will & Emery

[57] ABSTRACT

In a semiconductor integrated circuit device having a high breakdown voltage CMOS transistor integrated for programming a programmable element, the present invention is intended to solve a problem of the drain breakdown voltage of the high breakdown voltage transistor going low as a result of a structure that the standard transistor and the high breakdown voltage transistor share common channel dope region. On a P-type monocrystal silicon substrate of 10–20 Ωcm specific resistivity having a P-well region and a silicon oxide film for separating the elements, a channel dope region for an insulated-gate type field effect transistor A and a channel dope region for an insulated-gate type field effect transistor B are formed separately, making the impurity concentration in one channel dope region two to ten times as high as that in the other channel dope region. By so doing, the characteristics of the two kinds of insulated-gate type field effect transistors may be controlled independently, dispersion in the electrical characteristics of the high breakdown voltage CMOS transistor is suppressed, and the area for the same is made smaller.

6 Claims, 3 Drawing Sheets

METHOD FOR MANUFACTURING LOW BREAKDOWN VOLTAGE MOS AND HIGH BREAKDOWN VOLTAGE MOS

FIELD OF THE INVENTION

The present invention is related to a logic semiconductor integrated circuit device on which an insulated-gate type field effect transistor operational under a normal supply voltage, for example a CMOS transistor, and a high breakdown voltage insulated-gate type field effect transistor such as a high breakdown voltage CMOS transistor for writing in a programmable element are integrated, and a method of manufacturing the same.

BACKGROUND OF THE INVENTION

A gate array device which allows a LSI designer to program and implement a desired circuit, or a FPGA (Field Programmable Gate Array), has become popular. The most prospective among the programmable elements for FPGA is an antifuse element. The programming voltage Vpp of an antifuse element needs to be set so that Vpp/2 is higher than the supply voltage for the logic circuit. Therefore, for programming an antifuse element, a so called high breakdown voltage transistor whose drain breakdown voltage is higher than the logic circuit supply voltage is required.

A conventional integrated circuit device is described in the following with reference to FIG. 3(a) through FIG. 3(d), using its manufacturing method as the vehicle.

Among various elements of FPGA, FIG. 3 illustrates the cross sectional structure of a standard N-channel type MOS transistor constituting a logic circuit (hereinafter referred to as an N-channel standard transistor or simply as a standard transistor) and an N-channel type high breakdown voltage MOS transistor for programming in an antifuse element (hereinafter referred to as an N-channel high breakdown voltage transistor or simply as a high breakdown voltage transistor).

FIG. 3(a) shows oxide film etching process for forming a gate insulation film of a specified thickness for each of the N-channel standard transistor and the N-channel high breakdown voltage transistor; on a P-type monocrystal silicon substrate 1 a P-well region 2, a thick silicon oxide film 3 for separating elements and a channel dope region 4 are provided. After a first gate insulation film 5 is formed, at least a region for forming an N-channel high breakdown voltage transistor is covered with a first resist film 6, and a gate insulation film (not shown) on a region for forming a N-channel standard transistor is selectively removed by a buffered hydrofluoric acid etc.

Then, as shown in FIG. 3(b), a second gate insulation film 7 is formed after the first resist film 6 is removed, and a polycrystalline silicon 8 doped with N-type impurities such as phosphorus is grown to make a gate electrode.

Then, as FIG. 3(c) shows, a first gate electrode 9 for high breakdown voltage transistor and a second gate electrode 10 for standard transistor are formed by selectively etching off the polycrystalline silicon film 8. And then, using the gate electrode 9 and the gate electrode 10 as the mask, an N⁻-type diffusion layer region 12 which is to become an offset diffusion layer and an N⁻-type diffusion layer region 13 which is to become an LDD are formed by a self-aligned ion-implantation of N-type impurities 11 such as phosphorus.

Then, as shown in FIG. 3(d), the first gate electrode 9 and the second gate electrode 10 are provided respectively with a first side wall spacer 14 and a second side wall spacer 15. By ion-implanting N-type impurities 17 such as arsenic using a second resist film 16 as the mask, an N⁻-type offset diffusion layer 18, an N+-type source region 19 and an N+-type drain region 20 are formed for the high breakdown voltage transistor; at the same time, an N⁻-type LDD diffusion layer 21, an N+-type source region 22 and an N+-type drain region 23 are formed for the standard transistor.

In the above described conventional semiconductor integrated circuit device, the standard transistor and the high breakdown voltage transistor share the channel dope region 4 in common; as a result, there is a problem that if the impurity concentration in the channel dope region is raised for suppressing the short channel effect of standard transistor the drain breakdown voltage of the high breakdown voltage transistor goes down.

There are still other problems that the dispersion in the dimensions of the second resist film 16, the displacement of mask and other factors bring about a dispersion in the dimensions of the N⁻-type offset diffusion layer 18, which results in a dispersion in the electrical characteristics of high breakdown voltage transistor, particularly in the drain breakdown voltage and the saturation current. On the other hand, if the layout of transistor cell is determined taking the dispersion in processing into consideration for improving the electrical characteristics, the cell area inevitably goes larger, creating a new problem.

SUMMARY OF THE INVENTION

The present invention is intended to present a semiconductor integrated circuit device in which the short channel characteristic of standard transistor and the drain breakdown voltage characteristic of high breakdown voltage transistor are improved altogether, the dispersion in electrical characteristics of high breakdown voltage transistor is controlled, and the area of high breakdown voltage transistor is made smaller; as well as a method of manufacture therefor.

In a semiconductor integrated circuit device of the present invention on which a plurality of kinds of field effect transistors are integrated, each of the field effect transistors has a different impurity concentration in the channel dope region; in particular, in a semiconductor integrated circuit device on which two kinds of insulated-gate type field effect transistors are integrated, the impurity concentration in the channel dope region of a second insulated-gate type field effect transistor is made to be two to ten times as high that in the channel dope region of a first insulated-gate type field effect transistor.

A method for manufacturing the invented semiconductor integrated circuit device comprises the steps of forming a gate insulation film on a region for a first insulated-gate type field effect transistor and a second insulated-gate type field effect transistor, selectively doping impurities in a channel dope region on which the second insulated-gate type field effect transistor is to be formed, forming a first gate insulation film on a region for the first insulated-gate type field effect transistor by selectively removing the gate insulation film on a region where the second insulated-gate type field effect transistor is to be formed, forming a second gate insulation film on a region where the second insulated-gate type field effect transistor is to be formed, forming a first gate electrode of the first insulated-gate type field effect transistor and a second gate electrode of the second insulated-gate type field effect transistor, respectively, with an electroconductive film comprised of semiconductor or metal etc., conducting a self-aligned ion-implantation of N-type impurities at an implanting angle 40°–50° using the first gate electrode and the second gate electrode as the mask, forming a spacer to the side walls of the first and the second gate electrodes, and conducting a self-aligned ion-implantation of N-type impurities using the first and the second gate electrodes and the side wall spacers as the mask.

Therefore, according to the present invention, the respective gate insulation films to be used for the pluralities of kinds of field effect transistors may be formed with a desired film thickness, and the density of impurities in each channel dope region of respective field effect transistors may be differentiated. Thus the short channel characteristic of the standard transistor and the drain breakdown voltage characteristic of the high breakdown voltage transistor are improved at the same time, the dispersion in electrical characteristics of the high breakdown voltage transistor is put under the control, and area for the high breakdown voltage transistor is reduced.

DETAILED DESCRIPTION OF THE INVENTION

Figure 1:
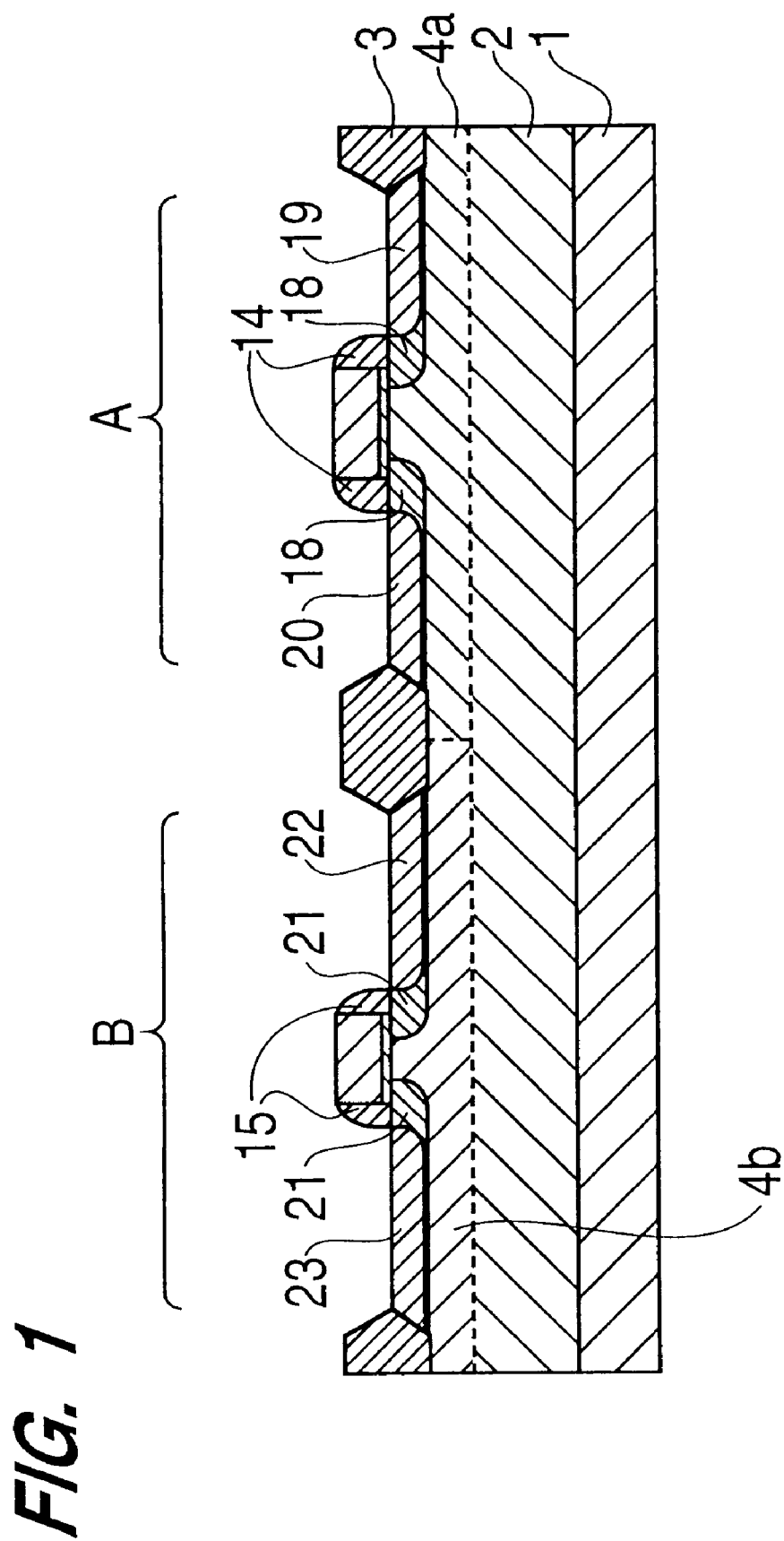
FIG. 1 is a cross sectional view showing a semiconductor integrated circuit device according to an embodiment of the present invention.

One object of the present invention is a semiconductor integrated circuit device on which a plurality of different kinds of field effect transistors are integrated, wherein the impurity concentration in the channel dope region of respective field effect transistors is differentiated. This makes it possible to improve the electrical characteristics of the plural kinds of field effect transistors altogether.

A second object of the present invention is a semiconductor integrated circuit device on which two kinds of insulated-gate type field effect transistors are integrated, wherein the impurity concentration in the channel dope region of a second insulated-gate type field effect transistor is made to be two to ten times as high that in the channel dope region of a first insulated-gate type field effect transistor. This enhances the drain breakdown voltage of the first insulated-gate type field effect transistor.

A third object of the present invention is a semiconductor integrated circuit device, wherein the first insulated-gate type field effect transistor is an N-channel type high breakdown voltage MOS transistor, the second insulated-gate type field effect transistor is an N-channel type MOS transistor. This raises the drain breakdown voltage of the N-channel type high breakdown voltage MOS transistor.

A fourth object of the present invention is a method for manufacturing a semiconductor integrated circuit device on which a first insulated-gate type field effect transistor and a second insulated-gate type field effect transistor are integrated, comprising the steps of forming a gate insulation film on a semiconductor substrate in a region where a first insulated-gate type field effect transistor and a second insulated-gate type field effect transistor are to be formed, selectively doping impurities in a channel dope region of the second insulated-gate type field effect transistor, forming a first gate insulation film on a region of the first insulated-gate type field effect transistor by selectively removing the gate insulation film on a region of the second insulated-gate type field effect transistor, forming a second gate insulation film on a region of the second insulated-gate type field effect transistor, and forming a first gate electrode of the first insulated-gate type field effect transistor and a second gate electrode of the second insulated-gate type field effect transistor respectively with an electroconductive film comprised of semiconductor or metal etc. Thereby, the first gate insulation film and the second gate insulation film for the first and the second insulated-gate type field effect transistors may be formed respectively with a specified thickness, and respective channel dope regions of the first and the second insulated-gate type field effect transistors may have a different impurity concentration.

A fifth object of the present invention is a method for manufacturing a semiconductor integrated circuit device on which a first insulated-gate type field effect transistor and a second insulated-gate type field effect transitor are integrated, wherein the process for forming a diffusion region which is to become a source and a drain comprises the steps of conducting a self-aligned ion-implantaion of N-type impurities at an angle of 40°–50° of elevation using the first gate electrode and the second gate electrode as the mask with the semiconductor substrate revolving, forming a spacer to the side wall of the first and the second gate electrodes, and conducting a self-aligned ion-implantation of N-type impurities using the first and the second gate electrodes and the side wall spacers as the mask. Thereby, an offset diffusion layer of the second insulated-gate type field effect transistor may be formed by self-alignment, the dimensional dispersion of the offset diffusion layer may be suppressed; as a result, the dispersion in electrical characteristics of second insulated-gate type field effect transitor, in particular the drain breakdown voltage and the saturation current, may be suppressed. Furthermore, in forming the offset diffusion layer, it turns out to be unnecessary to consider the dimensional dispersion of resist film and the masking margin, and the area for second insulated-gate type field effect transitor may be reduced.

In the following, preferred embodiments of the present invention will be described with reference to FIG. 1 and FIG. 2. Those constituent parts having equivalent functions as in FIG. 3 are designated with the same numerals, and detailed explanation of which are omitted here. The descriptions will be made on the points of difference.

(Embodiment 1)

FIG. 1 shows a first embodiment of the present invention. In FIG. 1, symbol A denotes an N-channel high breakdown voltage transistor, or a first insulated-gate type field effect transistor, and symbol B denotes an N-channel standard transistor, or a second insulated-gate field effect transistor.

What is different in the structure of the invented semiconductor integrated circuit device from the structure of FIG. 3 is that in the former the first insulated-gate type field effect transistor has a first channel dope region 4a which is structured separate from a second channel dope region 4b of the second insulated-gate type field effect transistor, the impurity concentration in the second channel dope region 4b being two to ten times as high that of the first channel dope region 4a.

(Embodiment 2)

A method for manufacturing a semiconductor integrated circuit device according to a second embodiment of the present invention is described in the following.

FIG. 2(a)–FIG. 2(d) are cross sectional views showing the processing steps for forming an N-channel standard transistor and an N-channel high breakdown voltage transistor, among a number of consituent elements of the FPGA.

Figure 2A:
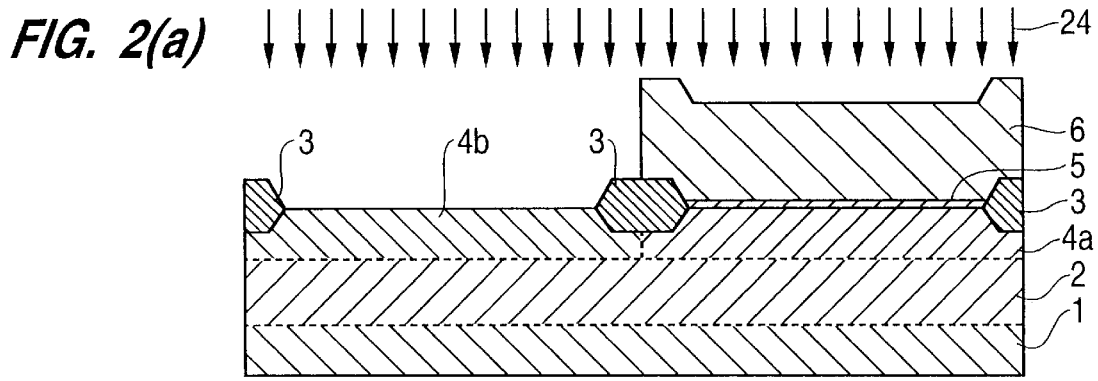
FIG. 2(a), FIG. 2(b), FIG. 2(c) and FIG. 2(d) are cross sectional views showing the process steps for manufacturing the semiconductor integrated circuit device of FIG. 1.

FIG. 2(a) shows an oxide film etching process for forming a gate oxide film of a certain desired thickness for each of the N-channel standard transistor B and the N-channel high breakdown voltage transistor A, as well as a process of doping impurities in the channel region of N-channel standard transistor B; on a P-type monocrystal silicon substrate 1 having a specific resistivity 10–20 Ωcm, a P-well region 2 is provided, and then a silicon oxide film 3 of 300–500 nm thick for separating the elements and a first channel dope region 4a are provided. After forming a first gate oxide film 5 of 15–30 nm thick, a region for forming the N-channel high breakdown voltage transistor A is covered with a first resist film 6, and a second channel dope region 4b is formed on a channel region for N-channel standard transistor B by selectively ion-implanting P-type impurities 24, e.g. boron, with the doping quantity $5\times10^{11}$–$5\times10^{12}$ cm$^{-2}$.

Then, the first gate oxide film 5 on a region in which the N-channel standard transistor B is to be formed is selectively removed by a buffered hydrofluoric acid etc. The impurity concentration in the second channel dope region 4b being twice to ten times as high that in the first channel dope region 4a.

Figure 2B:
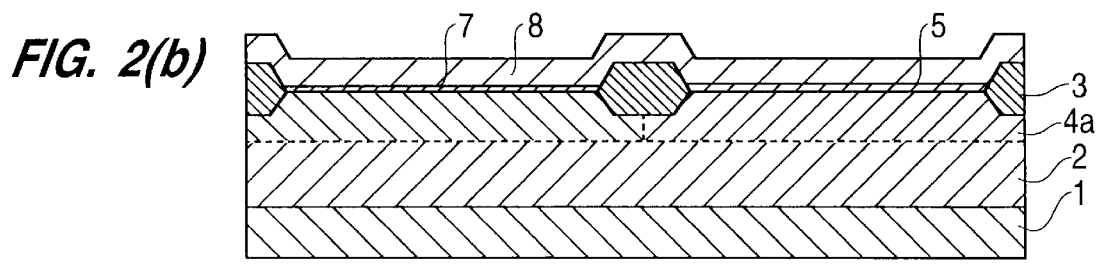

As shown in FIG. 2(b), after resist film 6 is removed, a second gate oxide film 7 of 5–15 nm thick is formed on the region of N-channel standard transitor B, and over it a polycrystalline silicon film 8 doped with N-type impurities such as phosphorus is grown to make a gate electrode for a thickness of 300–500 nm.

Figure 2C:
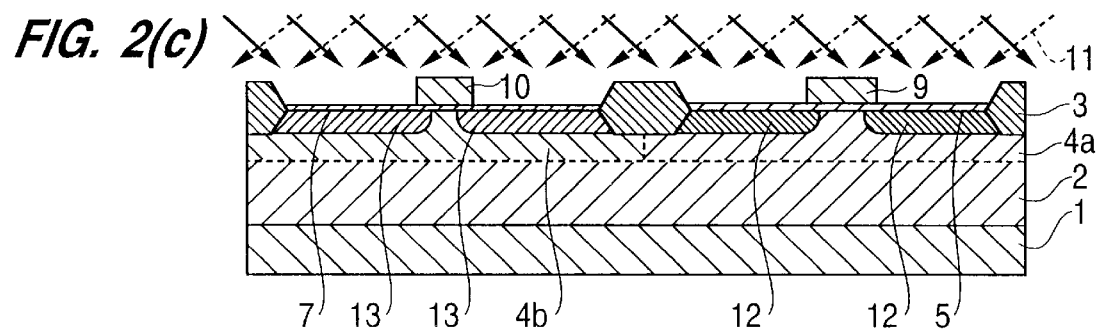

Next, as shown in FIG. 2(c), a first gate electrode 9 for the N-channel high breakdown voltage transistor and a second gate electrode 10 for the N-channel standard transistor are formed by selectively etching the polycrystalline silicon film 8, and then an N$^-$-type diffusion layer region 12 for making offset diffusion layer and an N$^-$-type diffusion layer region 13 for making LDD are formed by a self-aligned ion-implantation of N-type impurities 11 for example phosphorus using the first gate electrode 9 and the second gate electrode 10 as the mask. The phosphorus ion-implantation is conducted with an acceleration energy higher than 80 keV, a total doping quantity $2\times10^{13}$–$2\times10^{14}$ cm$^{-2}$, at an elevation angle 40°–50°, while revolving the semiconductor substrate 1.

Figure 2D:
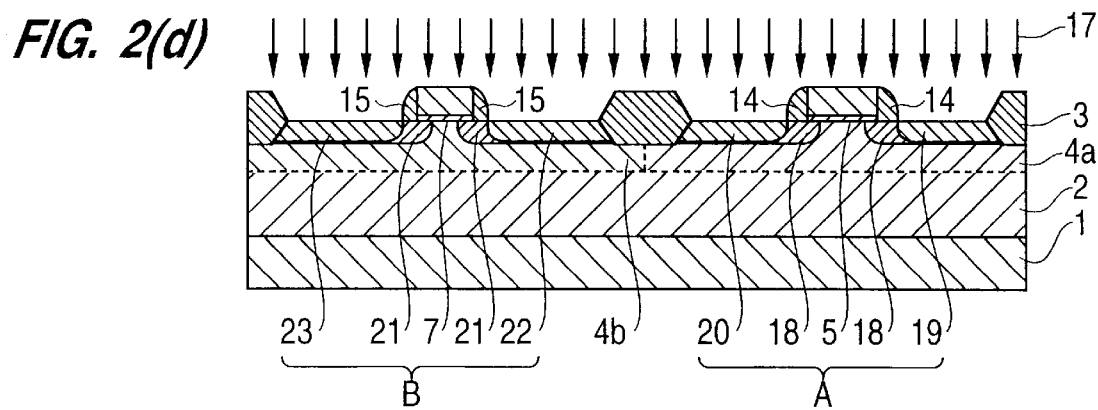
Figure 3A:
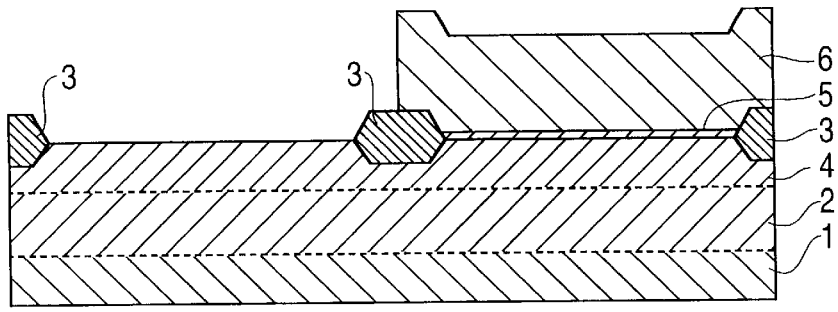
FIG. 3(a), FIG. 3(b), FIG. 3(c) and FIG. 3(d) are cross sectional views showing the conventional process steps for manufacturing a semiconductor integrated circuit device.
Figure 3B:
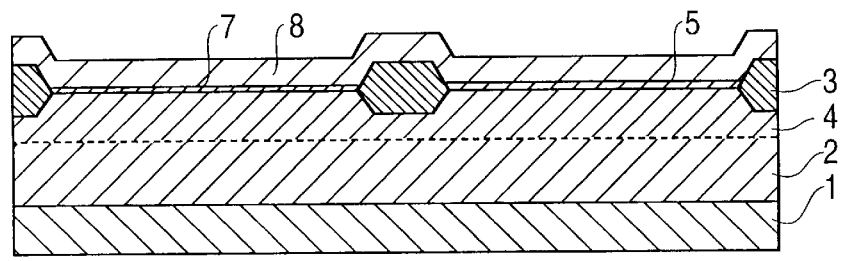
Figure 3C:
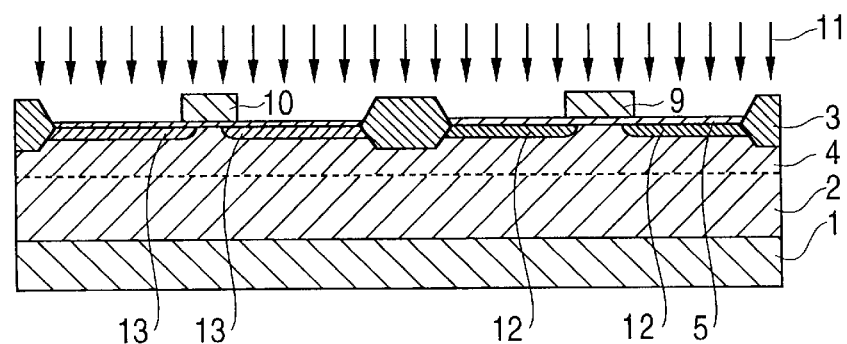
Figure 3D:
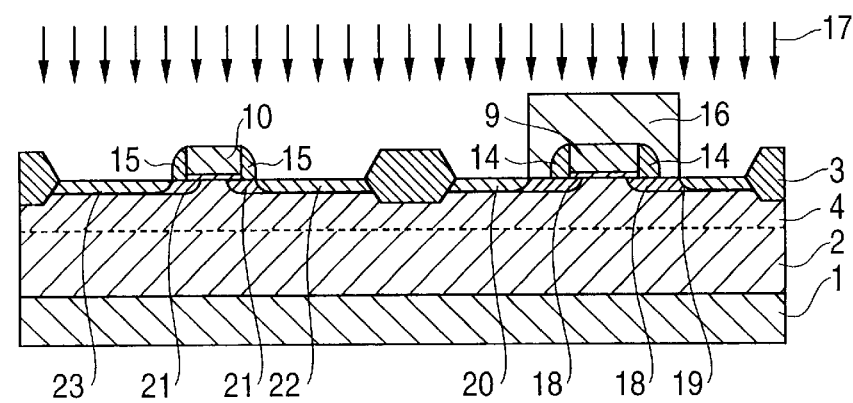

Further, as shown in FIG. 2(d), after the first gate oxide film 5 and the second gate oxide film 7 are selectively etched off using the first and the second gate electrodes 9, 10 as the mask, a first side wall spacer 14 is formed to the first gate electrode 9, and a second side wall spacer 15 is formed to the second gate electrode 10.

As the next step, an N$^-$-type offset diffusion layer 18, an N+-type source region 19 and an N+-type drain region 20 are formed by ion-implanting N-type impurities 17, e.g. arsenic, for the high breakdown voltage transistor, at the same time an N$^-$-type LDD diffusion layer 21, an N+-type source region 22 and an N+-type drain region 23 are formed for the standard transistor.

Thus, according to the present embodiment, the N-channel standard transistor B and the N-channel high breakdown voltage transistor A are provided respectively with gate oxide film 7 and gate oxide film 5, each of the films having its own desired film thickness. And channel dope regions 4a, 4b, may be formed each with a desired impurity different to each other. The characteristics of the N-channel standard transistor B and the N-channel high breakdown voltage transistor A may be controlled independently.

Furthermore, according to the present embodiment the formation of offset diffusion layer 18 of N-channel high breakdown voltage transistor A is self-aligned. Namely, the dimensions of offset diffusion layer 18 is not affected by the dispersion in the dimensions of resist film or the displacement of masking which is intrinsic to a conventional mask process, and the dispersion of electrical characteristics, i.e. the drain breakdown voltage and saturation current, caused by the processing dispersion is not enlarged; and the dispersion in the electrical characteristics of N-channel high breakdown voltage transistor A is suppressed.

In laying out the N-channel high breakdown voltage transistor A, it is not necessary to consider the dispersion of resist film dimensions and the masking margin which conventionally accompanied the formation of the N$^-$-type offset diffusion layer 18. This allows a person to make the area of N-channel high breakdown voltage transistor A smaller.

As described above, the channel dope region of a semiconductor integrated circuit according to the present invention have been formed separately, a first channel dope region of the first insulated-gate type field effect transistor and a second channel dope region of the second insulated-gate type field effect transistor; wherein the impurity concentration in the second channel dope region is two to ten times as high that in the first channel dope region. This allows to control the characteristics of the two different kinds of insulated-gate type field effect transistors independently; therefore, the drain breakdown voltage of high breakdown voltage insulated-gate type field effect transistor may be raised. Also, the dimensional dispersion during the processing of offset diffusion layer of the high breakdown voltage insulated-gate type field effect transistor may be suppressed, and the dispersion in the electrical characteristics may be suppressed either. Furthermore, the area for a high breakdown voltage insulated-gate type field effect transistor may be made smaller.

What is claimed is:

1. A method for manufacturing a semiconductor integrated circuit device having a first insulated-gate type field effect transistor and a second insulated-gate type field effect transistor integrated thereon, comprising the steps of:

forming a gate insulation film on a first region of a semiconductor substrate which includes the first region providing the first insulated-gate type field effect transistor and a second region providing the second insulated-gate type field effect transistor, wherein the first region and the second region are separated by a silicon oxide film and a first channel dope region is formed in the first region;

selectively doping impurities in the second region to form a second channel dope region;

forming a first gate insulation film on the first region by removing said gate insulation film on the second region so as to leave the gate insulation film on the first region;

forming a second gate insulation film on the second region; and forming a first gate electrode on the first region and a second gate electrode on the second region respectively with an electroconductive film comprised of either a semiconductor or a metal.

2. A method for manufacturing a semiconductor integrated circuit device according to claim 1, further comprising:

a step of forming a diffusion region comprising a source and a drain of the first insulated-gate type field effect transistor and the second insulated-gate type field effect transistor, the step of forming a diffusion region comprising the steps of:

conducting a self-aligned ion-implantation of N-type impurities at an angle of elevation using the first gate electrode and the second gate electrode as a mask while revolving the semiconductor substrate;

forming sidewall spacers to sidewalls of the first and second gate electrodes; and conducting a self-aligned ion-implantation of N-type impurities using the first and second gate electrodes and the sidewall spacers as a mask.

3. A method for manufacturing a semiconductor integrated circuit device according to claim 1, wherein in the step of selectively doping impurities, the second region is doped with a concentration of impurities 2 to 10 times as high as the concentration of impurities doped in the first region.

4. A method for manufacturing a semiconductor integrated circuit device according to claim 2, wherein in the step of selectively doping impurities, the second region is doped with a concentration of impurities 2 to 10 times as high as the concentration of impurities doped in the first region.

5. A method for manufacturing a semiconductor integrated circuit device according to claim 2, wherein the step of conducting a self-aligned ion-implantation of N-type impurities at an angle of elevation is performed at an angle of 40 to 50°.

6. A method for manufacturing a semiconductor integrated circuit device according to claim 2, further comprising:

the step of removing first and second gate insulation regions which are not directly under the first and second gate electrodes respectively, using the first and second gate electrodes as a mask, wherein said step of removing is performed between the steps of conducting a self-aligned ion-implantation and forming sidewall spacers.

* * * * *

UNITED STATES PATENT AND TRADEMARK OFFICE
CERTIFICATE OF CORRECTION

PATENT NO. : 5,946,575
DATED : August 31, 1999
INVENTOR : Yamaoka et al.

It is certified that error appears in the above-identified patent and that said Letter Patent is hereby corrected as shown below:

On the title page:

In the Foreign Application Priority Data section, change "Sept. 26, 1996" to --Sept. 6, 1996--.

Claim 1, line 41, delete "which includes"; and line 43, after "region" insert --of the semiconductor substrate, the second region--.

Signed and Sealed this

Ninth Day of May, 2000

*Attest:*

Q. TODD DICKINSON

*Attesting Officer*      *Director of Patents and Trademarks*